(12) United States Patent
Butzen

(10) Patent No.: US 12,445,056 B2
(45) Date of Patent: Oct. 14, 2025

(54) VOLTAGE REGULATOR DRIVERS AND CONVERTER STAGES

(71) Applicant: Intel Corporation, Santa Clara, CA (US)

(72) Inventor: Nicolas Butzen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 17/704,950

(22) Filed: Mar. 25, 2022

(65) Prior Publication Data

US 2023/0308021 A1 Sep. 28, 2023

(51) Int. Cl.
*H02M 3/158* (2006.01)
*H02M 1/08* (2006.01)
*H02M 1/14* (2006.01)

(52) U.S. Cl.
CPC ........... *H02M 3/1586* (2021.05); *H02M 1/08* (2013.01); *H02M 1/14* (2013.01)

(58) Field of Classification Search
CPC ........ H02M 3/1586; H02M 1/08; H02M 1/14; H02M 3/07; H02M 1/15
See application file for complete search history.

(56) References Cited

U.S. PATENT DOCUMENTS

| | | | |
|---|---|---|---|
| 10,541,623 B1 * | 1/2020 | Michal | H02M 7/487 |
| 2016/0149578 A1 * | 5/2016 | Lee | H03K 19/018514 327/108 |
| 2018/0145673 A1 * | 5/2018 | Bogner | H03K 17/08 |

OTHER PUBLICATIONS

Butzen, Nicolas, "A Single Topology Continuously Scalable Conversion Ratio Fully Integrated Switched Capacitor DC DC Converter with 0 to 2.22V Output and 93 percent Peak-Efficiency", 2018 IEEE Symposium on VLSI Circuits, Honolulu, HI, USA, 2018 doi: 10.1109 VLSIC.2018.8502308. pp. 103-104, (2018), 2 pages.
Butzen, Nicolas, "A 1.1W mm2 Power Density 82 percent Efficiency Fully Integrated 3.1 Switched Capacitor DC DC Converter in Baseline 28nm CMOS Using Stage Outphasing and Multiphase Soft Charging", 2017 IEEE International Solid-State Circuits Conference (ISSCC), San Francisco, CA, USA, 2017, pp. 178-179, doi: 10.1109 ISSCC.2017.7870319., (2017), 3 pages.

(Continued)

*Primary Examiner* — Kyle J Moody
(74) *Attorney, Agent, or Firm* — Schwegman Lundberg & Woessner, P.A.

(57) ABSTRACT

Power driver circuits may be used to provide higher voltage capabilities beyond what may managed by a single transistor. To reduce or eliminate effects associated with a stacked transistor voltage driver, a secondary stacked transistor voltage driver may be separated from a primary stacked transistor voltage driver, where the secondary driver is driven using time-shifted control signals. A switching schema may be used to interleave the several cells of a single continuous capacitive voltage regulator. A multi-stage approach may include both a number of fixed-ratio or multi-ratio capacitive voltage converter stages and final stage that is switched out of phase from the preceding stages, where the final stage includes a continuously scalable capacitive converter.

20 Claims, 11 Drawing Sheets

(56) References Cited

OTHER PUBLICATIONS

Schaef, Christopher, "A Fully Integrated Voltage Regulator in 14nm CMOS with Package Embedded Air Core Inductor Featuring Self-Trimmed, Digitally Controlled Variable On-Time Discontinuous Conduction Mode Operation", 2019 IEEE International Solid-State Circuits Conference—(ISSCC), San Francisco, CA, USA, doi: 10.1109 ISSCC.2019.8662294.pp. 154-156, (2019), 3 pages.

Serneels, Bert, "A 1.5W 10V Output Class D Amplifier Using a Boosted Supply from a Single 3.3V Input in Standard 1.8V 3.3V 0.18 microns CMOS", 2012 IEEE International Solid-State Circuits Conference, San Francisco, CA, USA, doi: 10.1109 ISSCC.2012.6176890.pp. 94-96, (2012), 3 pages.

Van Bruessegem, Tom, "A 82 percent Efficiency 0.5 percent Ripple 16-Phase Fully Integrated Capacitive Voltage Doubler", 2009 Symposium on VLSI Circuits, Kyoto, Japan, 2009, pp. 198-199, (2009), 2 pages.

\* cited by examiner

VOLTAGE REGULATOR DRIVERS AND CONVERTER STAGES

TECHNICAL FIELD

Embodiments described herein generally relate to voltage regulator circuits.

BACKGROUND

Power management circuits (e.g., power amplifiers, voltage regulators) may be used to provide higher voltage capabilities beyond what may be managed by a single transistor or other single device within a given technology, without compromising the circuit's reliability and longevity. One solution may include combining multiple devices in series (e.g., stacking) such that no single device experiences too high a voltage. These stacked devices may be able to provide a higher voltage, however, because some of the devices' parasitic capacitances, these configurations introduce inefficiencies such as voltage overshoots and larger voltage swings.

Another power management solution includes switching converters, which may provide improved efficiency over linear power regulators. However, the switching within these switching converters may result in increased output noise, especially when powering analog and mixed-signal circuits. The output voltage ripple, a major source of noise, of any capacitive voltage regulator (VR) may be approximated as follows:

$$\Delta V = \frac{I_{out}}{f_{sw} C_{out}}$$

$I_{out}$ is the output current, $f_{sw}$ is the frequency between any two switch events, and $C_{out}$ is the effective output capacitance seen at the output node. Even at higher switching converter frequencies (e.g., 100 MHz to 1 GHz), the converter ripple may exceed 100 mV, which may exceed typical switching converter ripple requirements of less than 10 mV to 20 mV. This ripple may be reduced by interleaving, which includes dividing a larger converter up into multiple smaller converters that are run out-of-phase of each other. This interleaving may increase the effective output frequency and reduce the ripple effect. However, interleaving may significantly increase the capacitor and transistor count. For a continuous capacitive voltage regulator, interleaving may result in more than 40 capacitors and more than 500 transistors, making interleaving impractical. Another solution may include running the voltage converter faster than optimal. However, this is also impractical for a continuous capacitive voltage regulator, as the load current increases proportionally to the switching frequency $f_{sw}$ as follows:

$$I_{out} \approx \frac{f_{sw} C_{fly} V_{in}}{\text{\# Phases}}$$

$V_{in}$ is the input voltage and #Phases is the number of phases of the continuous capacitive VR.

Another power management solution includes continuously scalable capacitive VRs. These VRs may provide improved regulation efficiency of the output voltage without requiring a modified topology that is typically needed for fixed-ratio switched-capacitor converters. However, the continuously scalable capacitive VRs require that all of its capacitors have to be able to receive close to the entire input voltage, and require a significant portion of its switches to be rated for voltages up to the difference between the input voltage and output voltage. As the input voltage is increased beyond the voltage rating of the transistors and other VR component devices, these capacitors and switches have to be implemented using stacked devices, which reduces efficiency and power density. Further, as the input voltage increases, more intermediate nodes (e.g., more power transistors) are needed to reduce charge-sharing losses and maintain efficiency. Fixed-ratio capacitive VRs may be used to convert high input voltages to low output voltages, but these fixed-ratio capacitive VRs rapidly lose efficiency as the output voltage deviates too much from an ideal divided input voltage.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
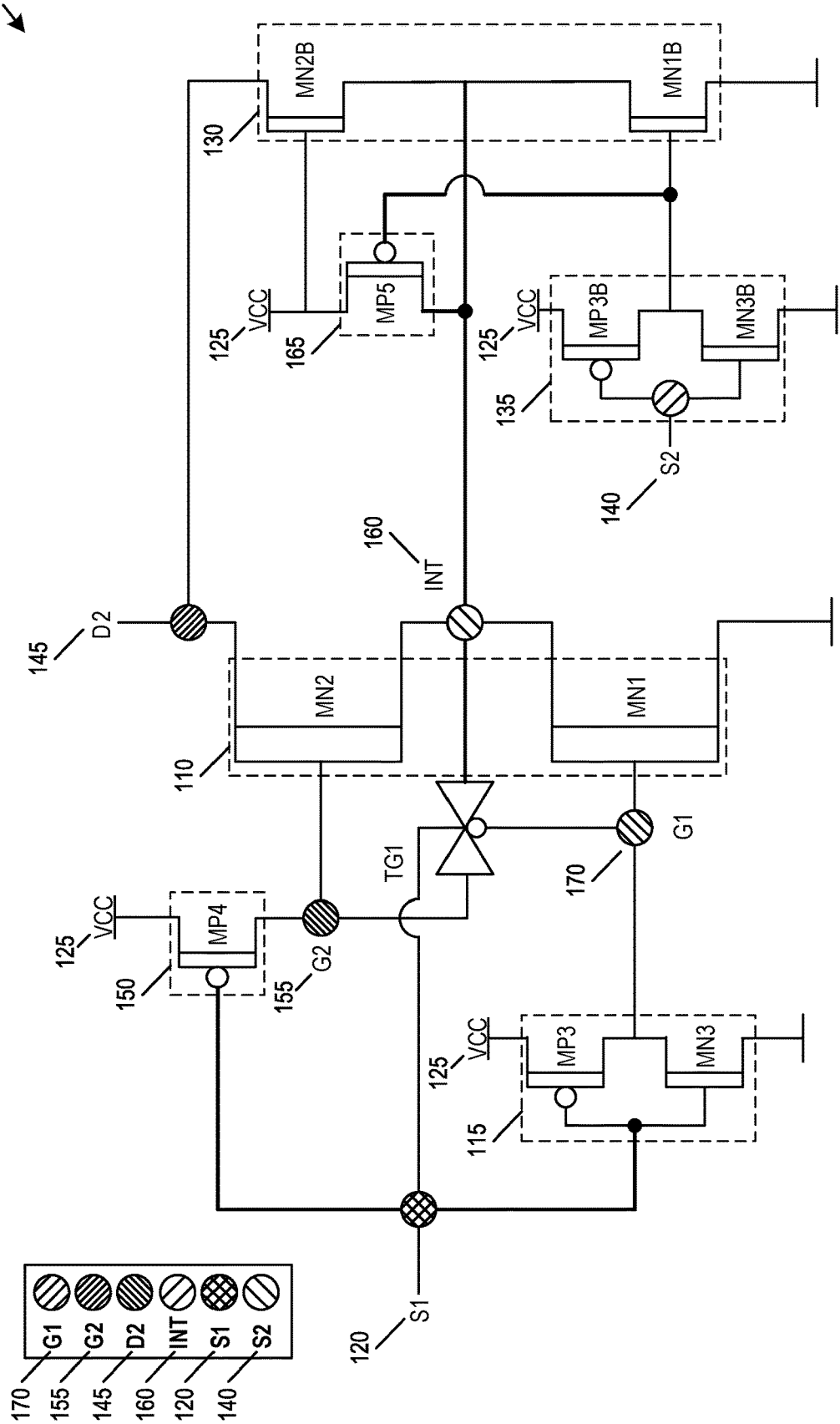
FIG. 1 is a circuit diagram illustrating a stacked transistor voltage circuit, according to an embodiment.

The circuits and methods described herein provide technical solutions for technical problems facing VRs and other power management circuits. To reduce or eliminate effects associated with a stacked transistor voltage driver, additional driver circuits and precharge circuits may be used. One technical solution includes a secondary stacked transistor voltage driver that is separated from a primary stacked transistor voltage driver, where the secondary driver is driven using time-shifted control signals. A small precharge circuit may be used to precharge an intermediate node between the primary and secondary drivers. A driver circuit may also be used to tie the primary voltage driver's gate to its source. This solution may be used to tie the stacked devices' nodes to a fixed voltage during a voltage transition (e.g., logical low to logical high, logical high to logical low), which may reduce overshoot or undershoot and may reduce voltage swing on the devices' parasitic capacitors during transitions. This solution may significantly reduce the required driving energy of the stacked transistor voltage driver (e.g., reduction of 35% or more), which will significantly improve overall system efficiency.

A technical solution to problems facing interleaved switching converters may include application of a switching schema to interleave the several cells of a single continuous capacitive voltage regulator. This schema provides efficiency improvements over solutions that interleave different instances of the continuous capacitive voltage regulator. This schema may significantly increase the effective switching frequency, which may provide a significant reduction in the output voltage ripple. In an example, for a VR circuit with a 1V input, 15 cells, and no dedicated output decoupling, the effective output voltage ripple may be reduced from 130 mV to 16 mV or lower using this schema. This schema provides a solution that does not increase the total capacitor or total power-transitory count, does not increase the decoupling capacitor at the output of the converter, and maintains the same continuous capacitive VR switching behavior.

A technical solution to problems facing continuously scalable capacitive VRs may include a multi-stage approach that includes both a number of fixed-ratio or multi-ratio capacitive voltage converter stages that generate an intermediate voltage (e.g., fixed-ratio division from the input voltage). This solution may also include a final stage that is switched out of phase from the preceding stages, where the final stage includes a continuously scalable capacitive converter. The final stage may provide the output voltage regulation, and the preceding stages before the final stage may be unregulated, loosely regulated, or tightly regulated. These preceding stages provide high-voltage capability, and may provide improved efficiency by maintaining their output voltage close to their ideal divided-input voltage. Because the preceding stages provide a reduced intermediate voltage to the last stage, the last stage does not have to stack its active and passive devices, which enables the last stage to be more power-efficient while still providing excellent regulation over the desired output voltage range. Additionally, the number of intermediate nodes in the final stage may be reduced, which may reduce transistor count and number of converter cells, leading to a more practical design. Additionally, because the final stage is switching at different time instances relative to the previous stages, this provides a soft-charging effect, and the final stage may further reduce the number of intermediate nodes. This provides a reduction in complexity, and provides an improved transistor efficiency and power density.

In the following description, for purposes of explanation, numerous specific details are set forth to provide a thorough understanding of some example embodiments. It will be evident, however, to one skilled in the art that the present disclosure may be practiced without these specific details.

FIG. 1 is a circuit diagram illustrating a stacked transistor voltage circuit 100, according to an embodiment. Circuit 100 includes a first stacked transistor voltage converter circuit 110. The first converter circuit 110 may be coupled to a first stacked transistor driver circuit 115. The first driver circuit 115 may be coupled to receive a first voltage transition input signal S1 120 and a common collector voltage (Vcc) 125. The first driver circuit 115 may be formed using smaller transistors (e.g., transistors with a shorter conducting channel) than the first stacked transistor voltage converter circuit 110. In an example, the first driver circuit 115 includes an upper p-channel transistor and a lower n-channel transistor.

Circuit 100 includes a second stacked transistor voltage converter circuit 130 coupled to the first converter circuit 110. The second converter circuit 130 is coupled to a second stacked transistor driver circuit 135. The second driver circuit 135 is coupled to receive a second voltage transition input signal S2 140 and Vcc 125. The second driver circuit 125 may be formed using smaller transistors than the second stacked transistor voltage converter circuit 130. In an example, the second driver circuit 125 includes an upper p-channel transistor and a lower n-channel transistor.

Circuit 100 may include a drive transistor MP4 150. The drive transistor MP4 150 may also receive the first input signal S1 120 and drive a first upper gate node G2 155 between Vcc 125 and a source voltage at an intermediate node INT 160 based on the first input signal S1 120. Circuit 100 may also include a precharge transistor 165 coupled to intermediate node INT 160 and to the second converter circuit 130. The precharge transistor 165 may be used to precharge the intermediate node INT 160 to Vcc 125.

Based on first signal S1 120 and second signal S2 140, circuit 100 causes a transition of a voltage output signal at a first upper terminal D2 145 to transition from a low voltage logical state (e.g., logical 0) to a high voltage logical state (e.g., logical 1), or from the high voltage logical state to the low voltage logical state. In an example, the high voltage logical state may be associated with a voltage level that is greater than Vcc 125, and may be associated with a voltage level that is substantially equal to double Vcc 125. Similarly, the low voltage logical state may be associated with a voltage level that is substantially equal to a source supply voltage (Vss).

When transitioning the voltage from logical high to logical low, the first signal S1 120 may be a time-delayed version of the second signal S2 140. Conversely, when transitioning the voltage from low to high, the second signal S2 140 may be a time-delayed version of the first signal S1 120. In an example, a transition between logical states may include a transition from a voltage level substantially equal to double Vcc to a voltage level substantially equal to Vss. Examples of these state transitions are shown in greater detail in FIGS. 2A-2D.

Figure 2:
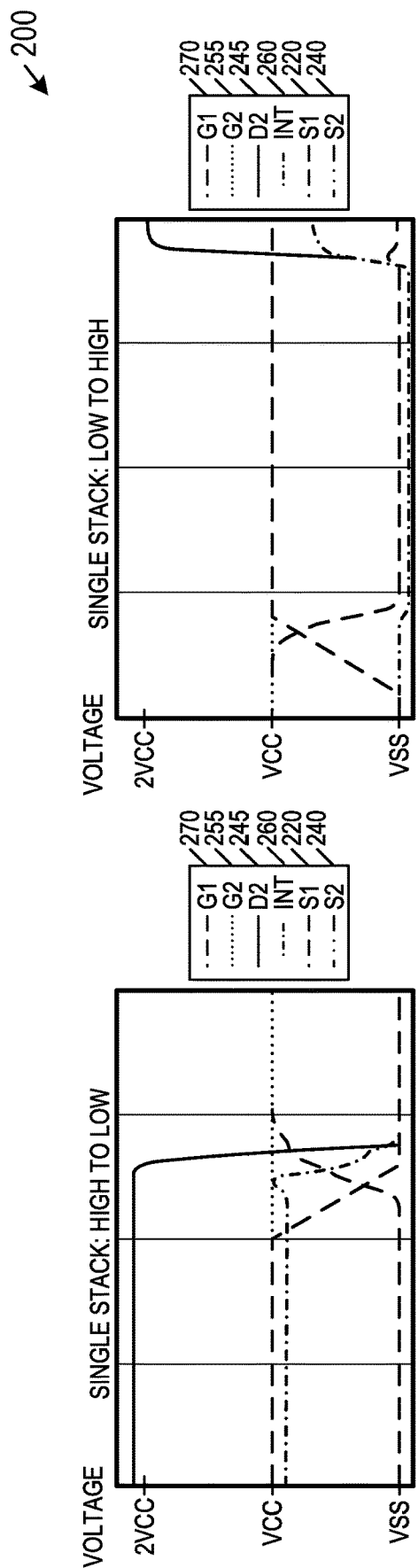
FIGS. 2A-2D are voltage waveform graphs, according to an embodiment.

FIGS. 2A-2D are voltage waveform graphs 200, according to an embodiment. For each of the four graphs 200, the voltage levels correspond to nodes shown in FIG. 1, including G1 270, G2 255, D2 245, INT 260, S1 220, and S2 240. FIG. 2A shows a transition from a high voltage logical state to a low voltage logical state for a single transistor stack, such as when using only a first stacked transistor voltage converter circuit 110. Similarly, FIG. 2B shows a transition from the low voltage logical state to the high voltage logical state for a single transistor stack. When using a single transistor stack, only one set of control signals G1 270 are used to drive a low side of a single transistor stack. The use of a single transistor stack results in various unwanted behaviors, such as overshoot or undershoot during voltage transitions on an intermediate node INT 260, the node D2 245. In contrast with circuit 100, the intermediate node is not actively switched to Vcc, and instead relies on leakage from an upper transistor to charge this node slowly. This slow charging takes current from the high side at twice the Vcc voltage, which introduces ineffectiveness and may pose a potential overvoltage risk. Additionally, during the low-to-high transition shown in FIG. 2A, because the lower transistor gate is tied to Vcc, its gate-drain capacitance (Cgd) will see a (2×Vcc) voltage swing, which results in losing energy proportional to $(4 \times Vcc^2)$.

In contrast with the single transistor stack waveforms shown in FIG. 2A and FIG. 2B, voltage transitions for a stacked transistor voltage circuit are shown in FIG. 2C and FIG. 2D, such as for the stacked circuit 100 shown in FIG. 1. FIG. 2C shows a transition from the high voltage logical state to the low voltage logical state for a stacked transistor voltage circuit. Similarly, FIG. 2D shows a transition from the low voltage logical state to the high voltage logical state for a stacked transistor voltage circuit. As shown in the high to low transition in FIG. 2C, the second converter circuit is activated by S2 240 before the first converter circuit is activated by S1 220. As shown in the low to high transition in FIG. 2D, the second stacked transistor voltage converter circuit is deactivated by S2 240 after the first stacked transistor voltage converter circuit is activated by S1 220. This time delay between S1 220 and S2 240 allows for the transition of the drain and intermediate nodes before the large transistors activate, or maintains the voltage on those nodes while the large devices deactivate. This sequence significantly reduces the amplitude and length of overshoot or undershoot on INT 260 and D2 245.

Additionally, the use of a precharge transistor (e.g., MP5) charges the intermediate node INT 260 Vcc when the second converter circuit deactivates, which reduces energy loss. Further, tying the gate of a drive circuit (e.g., MN2) to source during a low to high transition results in two Vcc voltage steps for its Cgd, which results in an energy loss proportional to $(2 \times Vcc^2)$. approximately half of a single transistor stack. While FIG. 2D shows a voltage dip 280, this is caused by the Miller effect on the pull-up side, and results when a circuit is designed to improve or maximize energy efficiency. This voltage dip 280 may be reduced by changing the time delay between S1 220 and S2 240, or by changing the relative sizes of the second converter circuit and the first converter circuit.

Figure 3:
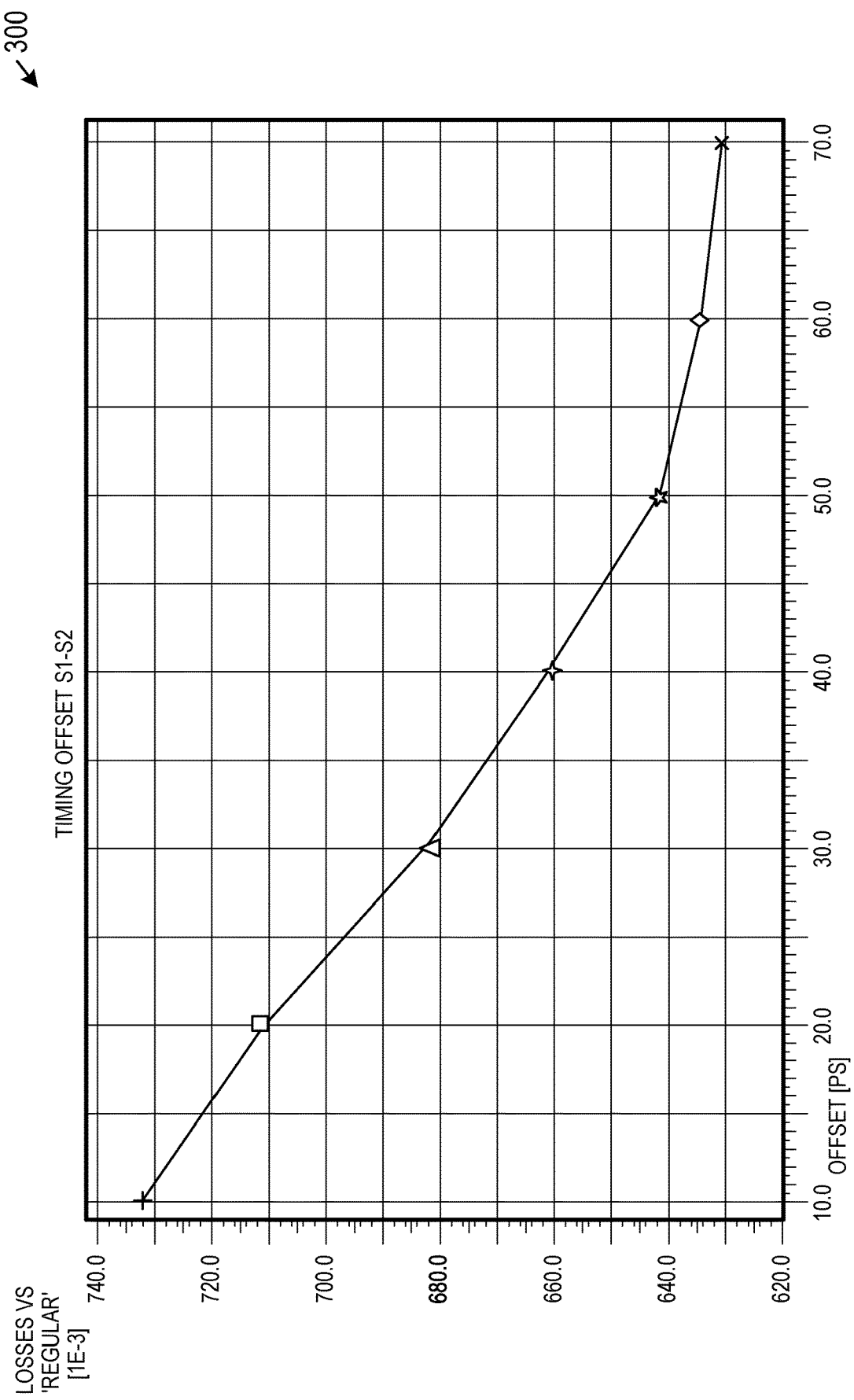
FIG. 3 is a timing offset graph, according to an embodiment.

FIG. 3 is a timing offset graph 300, according to an embodiment. Timing offset graph 300 shows the ratio of energy loss of the stacked transistor voltage circuit compared to a single transistor stack as a function of the timing offset between S1 and S2 control signals. The stacked transistor voltage circuit provides improvements at all time offsets, and may provide an energy improvement of 35% or more for larger time offsets. This energy loss based on time offset may be used to select a combination of a time offset and relative sizes of the second converter circuit and the first converter circuit, such as to provide a desired tradeoff between improved efficiency and voltage transition speeds.

Figure 4A:
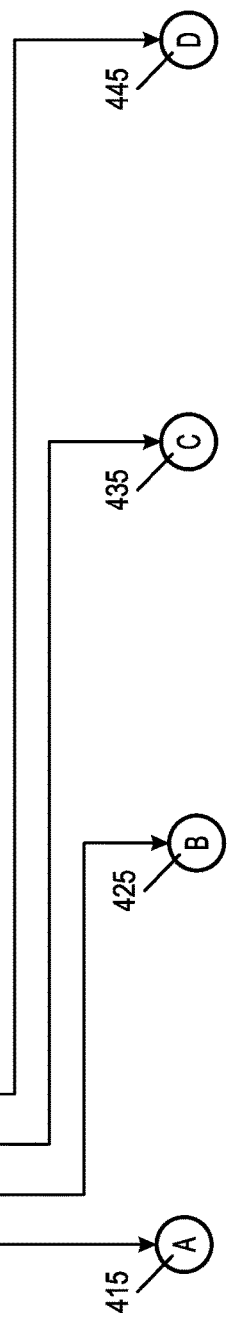
FIGS. 4A-4B are block diagrams showing a continuous capacitive voltage regulator switching schema, according to an embodiment.
Figure 4B:
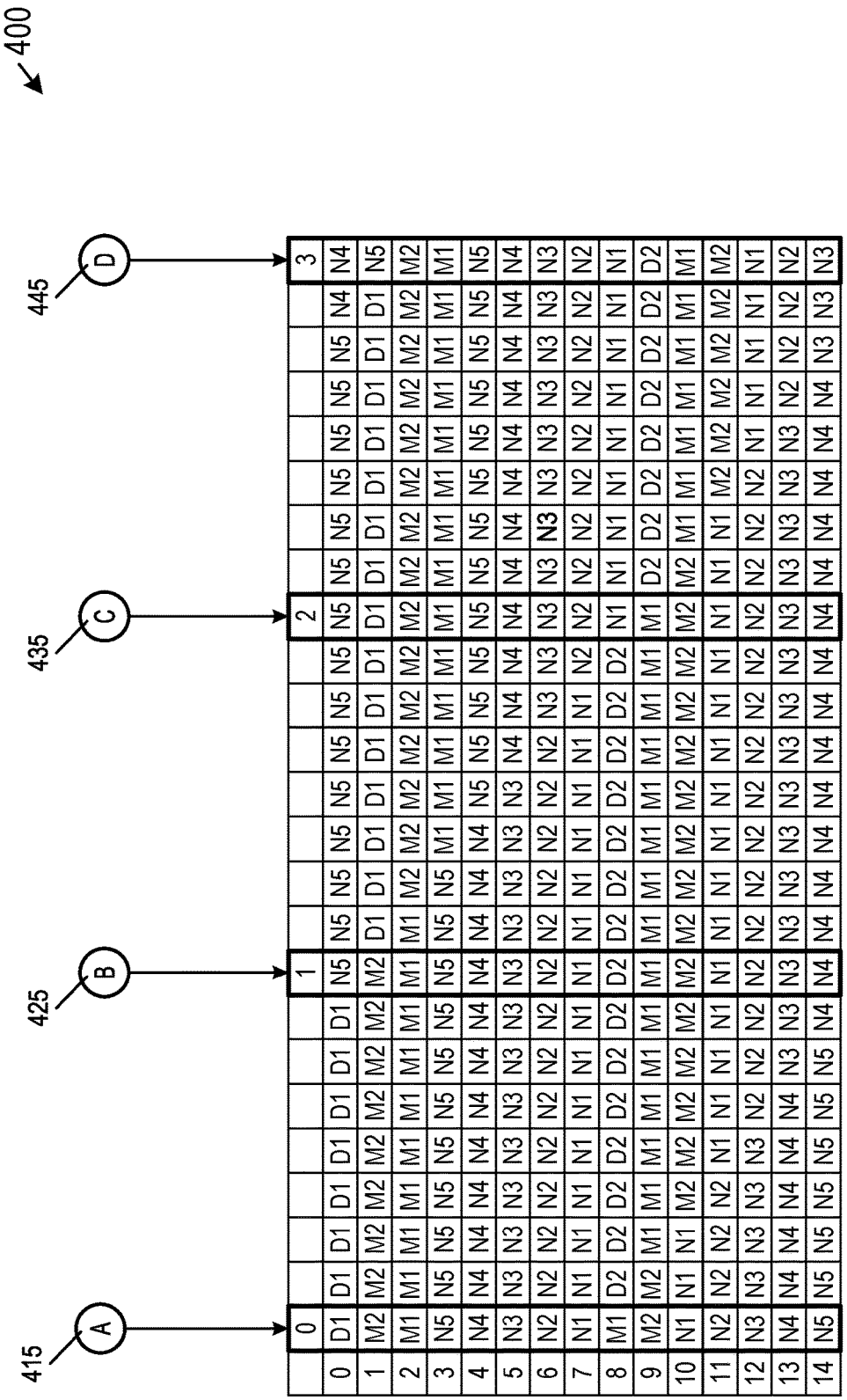

FIGS. 4A-4B are block diagrams showing a continuous capacitive voltage regulator switching schema 400, according to an embodiment. Switching schema 400 shows various states, including two intermediate top side rail states M1-M2, five bottom side flying capacitor states N1-N5, and two direct connection states D1-D2. Each column in switching schema 400 represents a particular instant in time or phase, and each row is a unique cell with an associated state. For example, the N5 state indicates the cell is connected to the last bottom-side intermediate node, the M1 state indicates the cell is connected to the first topside intermediate node, and the D1 state indicates the cell directly connects to a pair of VR terminals (e.g., Vin and Vout, Vout and Vss). While switching schema 400 shows the main connection of each cell's flying capacitor, the other electrode of the flying capacitor would be connected to a converter terminal.

As can be seen in state changes between columns shown in FIG. 4A, various cells have identical state progressions but are out of phase relative to each other. For example, state D1 410 in the first cell row may be followed by N5, N5, N4, N4, etc., which may correspond to the sequence beginning with state D1 420 in the second cell row, with state D1 430 in the third cell row, etc. In any transition between phases, several cells switch states simultaneously. For a continuous capacitive VR with a M top side rails and N bottom side rails, the switching schema may include $((2 \times M)+(2 \times N)+1)$ cells, with twice as many phases. During each phase transition, a total of $(M+N+1)$ cells will switch.

As shown in FIG. 4B, the clustered state transitions may be spread out to several unique phases, thereby increasing the total number of phases. The vertical states A 415, B 425, C 435, and D 445 from FIG. 4A correspond to the vertical states shown in FIG. 4B. In contrast with the transition schema shown in FIG. 4A, the number of additional phases between these corresponding columns in FIG. 4B is (M+N) (e.g., 7), which indicates the total number of phases for the full converter is increased by (M+N+1) (e.g., 8). To implement the phase transitions shown in FIG. 4B, the clustered state transitions may be spread out by changing the length (e.g., number of phases) in each cell state to $((2 \times M)+(2 \times N)+1)$ (e.g., 15 phases in FIG. 4B), and to apply a $((2 \times M)+(2 \times N)+1)$ phase offset (e.g., 16-phase offset) between subsequent cells.

The output ripple for such a continuous capacitive voltage regulator is therefore:

$$\Delta V \approx \frac{C_{fly}}{C_{out}} \frac{V_{in}}{\# \text{ Phases}}$$

When compared with the first switching schema shown in FIG. 4A, the switching schema shown in FIG. 4B reduces ripple by (M+N+1). The ripple may be reduced further by including a decoupling capacitor, where the decoupling capacitor may be selected to reduce size and cost. An example of the reduction in output ripple is shown in FIG. 5.

Figure 5:
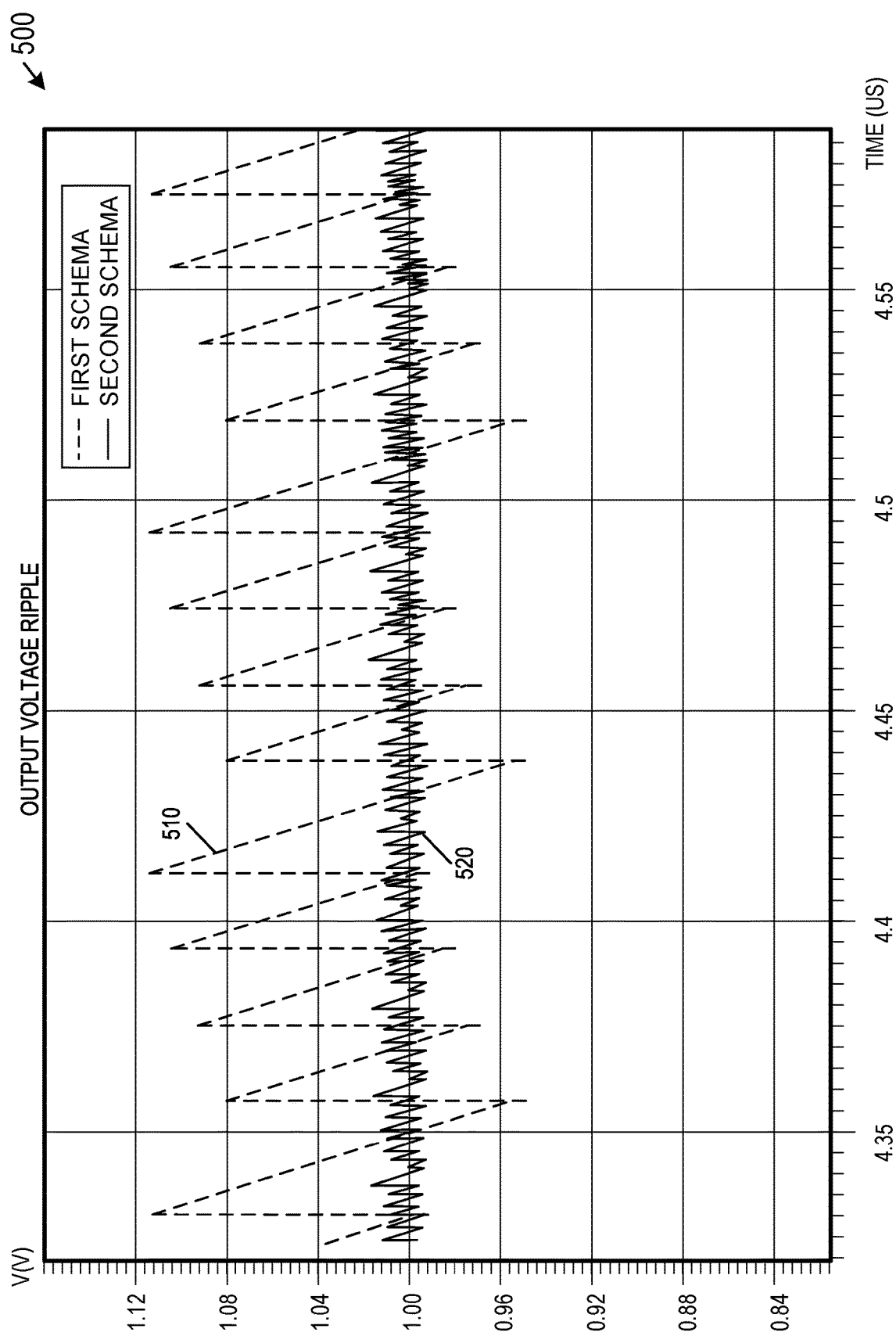
FIG. 5 is an output voltage ripple graph, according to an embodiment.

FIG. 5 is an output voltage ripple graph 500, according to an embodiment. Graph 500 shows an output voltage ripples for a continuous capacitive VR, and compares output voltage ripple using first schema 510 to output voltage ripple using the second schema 520. For both output voltage ripples, the continuous capacitive VR is using the same number of power transistors and flying capacitors, and both VRs are providing the same output current.

The second schema 520 provides a substantially lower peak-to-peak variation on its output. As shown in FIG. 5, the peak-to-peak variation may be reduced from approximately 160 mV down to approximately 20 mV, or an approximately 8× reduction in voltage ripple. This is consistent with the use of converter parameters M/N=2/5 and the predicted noise reduction of (M+N+1)=8.

In an example implementation of the second schema, a separate finite state machine (FSM) may be implemented for each cell (e.g., for each row of FIGS. 4A-4B). These FSMs may be triggered individually in accordance with the second schema. In another example implementation of the second schema, a central FSM may be used for all converter cells. The central FSM may be used to generate all of the power transistor control signals in accordance with the second schema.

Figure 6:
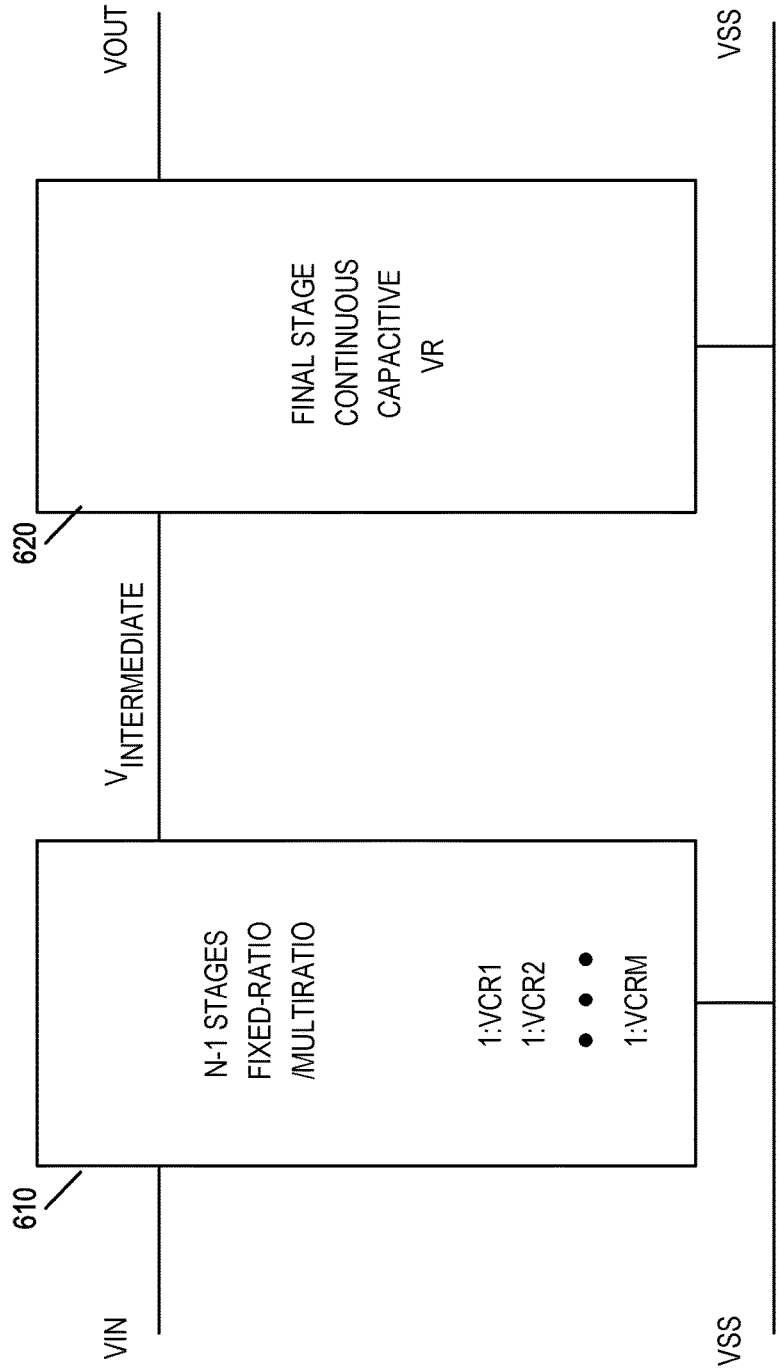
FIG. 6 is a multistage fixed-ratio and continuous capacitive VR circuit, according to an embodiment.

FIG. 6 is a multistage fixed-ratio and continuous capacitive VR circuit 600, according to an embodiment. The multistage VR circuit 600 includes a fixed-ratio stage group 610 and a final continuous capacitive stage 620. The fixed-ratio capacitive VRs within the fixed-ratio stage group 610 each provides excellent peak efficiency, but that efficiency drops rapidly as their output voltage deviates from an ideal output voltage, based on being a rational divider from its input voltage (e.g., from 2V to 1V). In contrast with the fixed-ratio capacitive VRs, the continuous capacitive VR within the final continuous capacitive stage 620 may maintain high efficiency even when its output voltage changes, but its peak efficiency is lower due to its reduced capacitor utilization. The continuous capacitive VR may also not scale as efficiently to higher input voltages, especially if the higher input voltage levels require power devices or flying capacitors to be stacked (e.g., put in series) to avoid electrical overstress (EOS).

In an example, a VR may be used to convert a 2.7V input to a 0.5V to 1.3V output voltage range. For a capacitor voltage rating of approximately 1.5V, a fixed-ratio 2:1 capacitive converter may not need to stack capacitors if the output voltage is limited to 1.2-1.3V. However, because the output voltage goes down to 0.5V, the worst-case voltage the capacitor could experience is 2.7V-0.5V=2.2V, and therefore stacking needs to be used. This may result in a deterioration of the peak efficiency of this example converter. Further, when the output voltage drops significantly below 2.7V/2=1.35V, the efficiency will drop rapidly. At the low Vout of 0.5V, the best-case efficiency of this approach may be reduced to 0.5/1.35V, or approximately 37%.

In another example, the use of a single continuous capacitive VR may provide improved efficiency across an entire Vout range. However, because the input voltage of the single continuous capacitive VR is also approximately the highest voltage that its flying capacitors experience, this may require stacking those capacitors, and may require stacking the transistors that connect to the top-plate of the flying capacitors. Additionally, a large number of cells (e.g., at least 25 cells) may be needed to maintain efficiency given the higher input voltage, each one with a unique capacitor and its own transistors, leading to a high device count. This increased device count may limit the output current capability of a single continuous capacitive VR.

The multistage VR circuit 600 addresses shortcomings of these examples by including both a fixed-ratio (e.g., 2:1 ratio) stage group 610 and a final continuous capacitive stage 620. The fixed-ratio stage group 610 may be used to generate an intermediate voltage of approximately 1.35V without requiring stacked flying capacitors, which improves its efficiency. The final continuous capacitive stage 620 may receive this intermediate voltage and provide the required voltage regulation to the desired 0.5-1.3V output. By receiving the intermediate voltage from the fixed-ratio stage group 610, the final continuous capacitive stage 620 may not need to stack any capacitors or stacked power field-effect transistors (powerFETs), which will improve current capability.

The fixed-ratio stage group 610 may include one or more fixed-ratio stages. This fixed-ratio stage group 610 may implement a set of fixed-conversion-ratios and switch between them, providing a selectable conversion ratio (e.g., gearbox) multi-ratio converter. The use of a multi-ratio converter may provide the ability to change the intermediate voltage or adapt to changes in the input voltage (e.g., variable battery voltage), where adapting to changes in the input voltage provides course-grain or fine-grain voltage regulation.

Figure 7A:
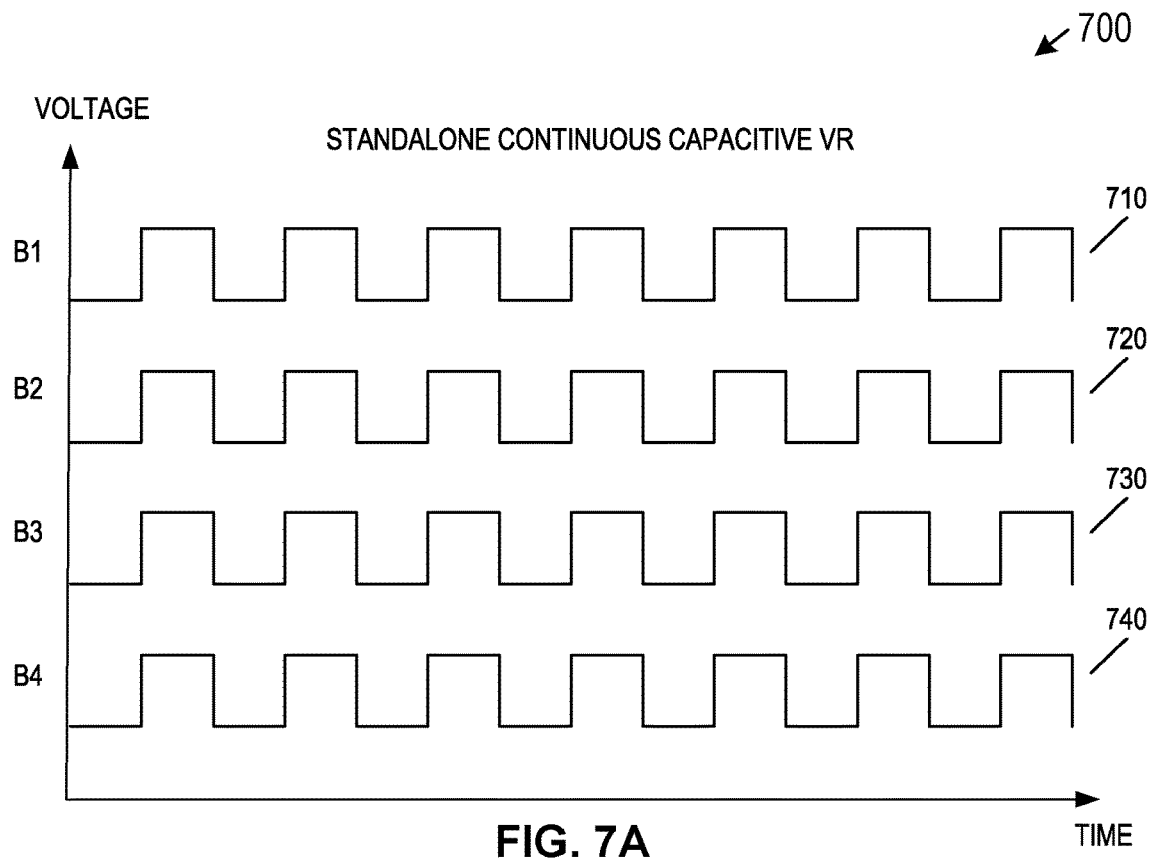
FIGS. 7A-7B are voltage waveform graphs, according to an embodiment.
Figure 7B:
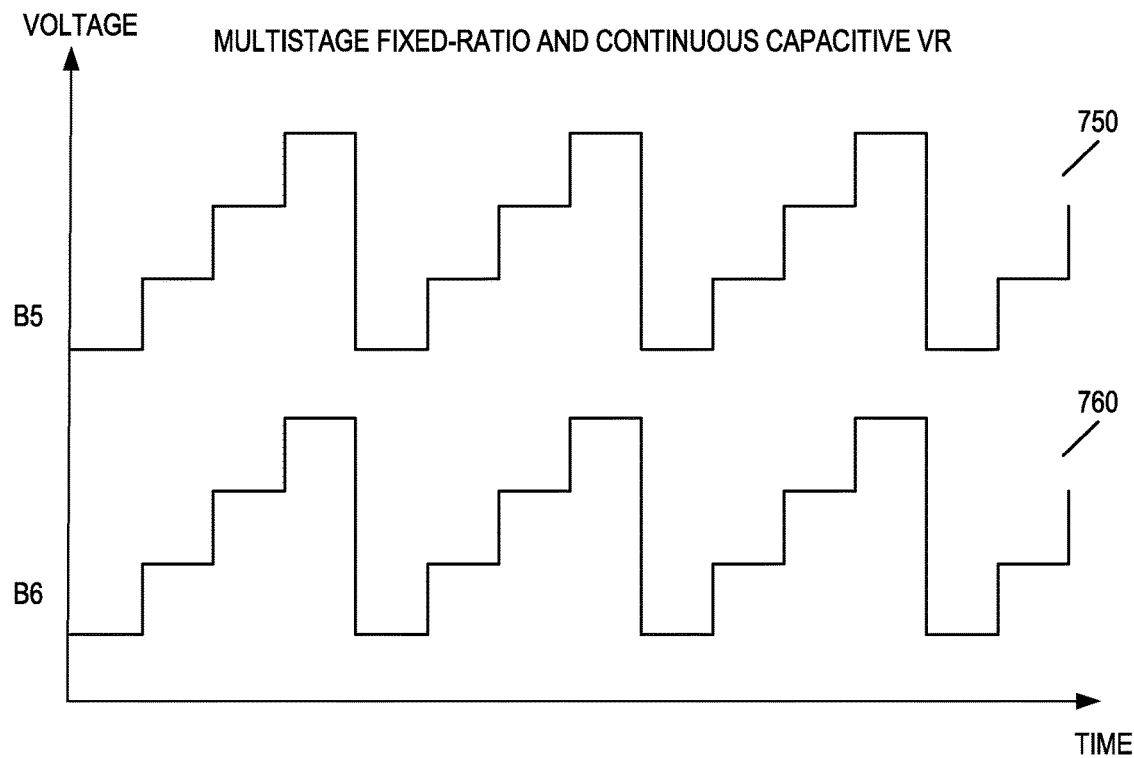

The multistage VR circuit 600 provides an improved balance of tradeoffs facing cascaded VRs. For cascaded VRs, the total efficiency is a product of the efficiencies of the individual VR stages. Having multiple stages typically reduces system complexity at the cost of overall efficiency or current capability. By including a fixed-ratio stage group 610 and a single final continuous capacitive stage 620, the multistage VR circuit 600 provides improved performance and reduced complexity FIGS. 7A-7B are voltage waveform graphs 700, according to an embodiment. FIG. 7A shows voltage waveforms for bottom-side intermediate rails B1-B4 710-740 for a standalone continuous capacitive VR. FIG. 7B shows voltage waveforms for bottom-side intermediate rails B5-B6 750-760 for a multistage fixed-ratio and continuous capacitive VR circuit, such as multistage VR circuit 600 shown in FIG. 6. For a multistage VR circuit, when these stages switch out-of-phase of each other, additional charge transfers may occur in both stages. In an example, the efficiencies of bottom-side intermediate nodes of the final continuous capacitive stage may be doubled by selecting appropriate relative sizes of the capacitors in the fixed-ratio stage group and in the final continuous capacitive stage. This efficiency improvement may also be used to halve the number of bottom-side intermediate nodes and connecting power transistors, resulting in half as many bottom-side intermediate rails B5-B6 750-760 as in B1-B4 710-740.

Figure 8A:
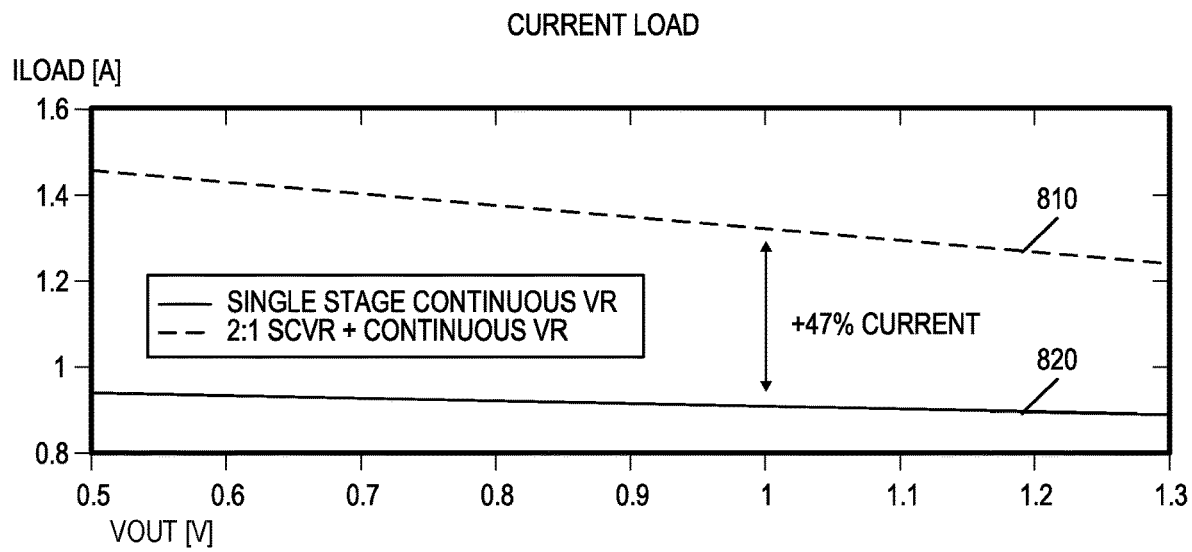
FIGS. 8A-8B are multistage current and efficiency graphs, according to an embodiment.
Figure 8B:
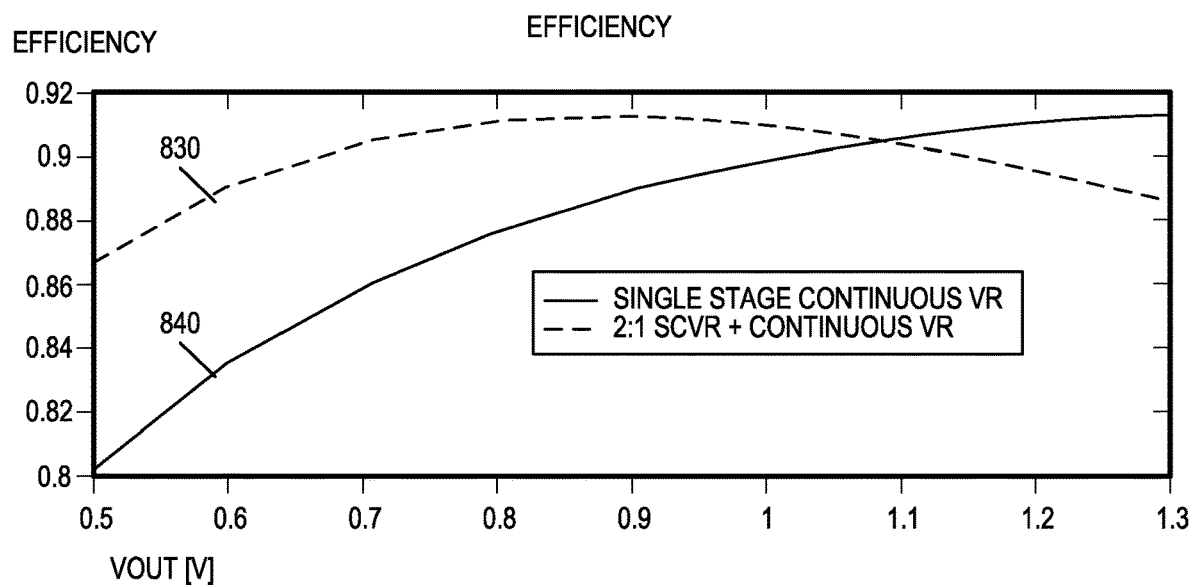

FIGS. 8A-8B are multistage current and efficiency graphs 800, according to an embodiment. Graphs 800 compare current and efficiency between a standalone continuous VR and a two-stage approach using a constant total capacitance and a 2.7V input voltage in both instances. FIG. 8A compares the current load as a function of output voltage for a multistage VR 810 and a single-stage continuous VR 820, showing a 47% increase in current capability in the multistage VR 810. FIG. 8B compares efficiency as a function of output voltage for a multistage VR 830 and a single-stage continuous VR 830, showing an increase in average efficiency over the desired output voltage range.

Figure 9:
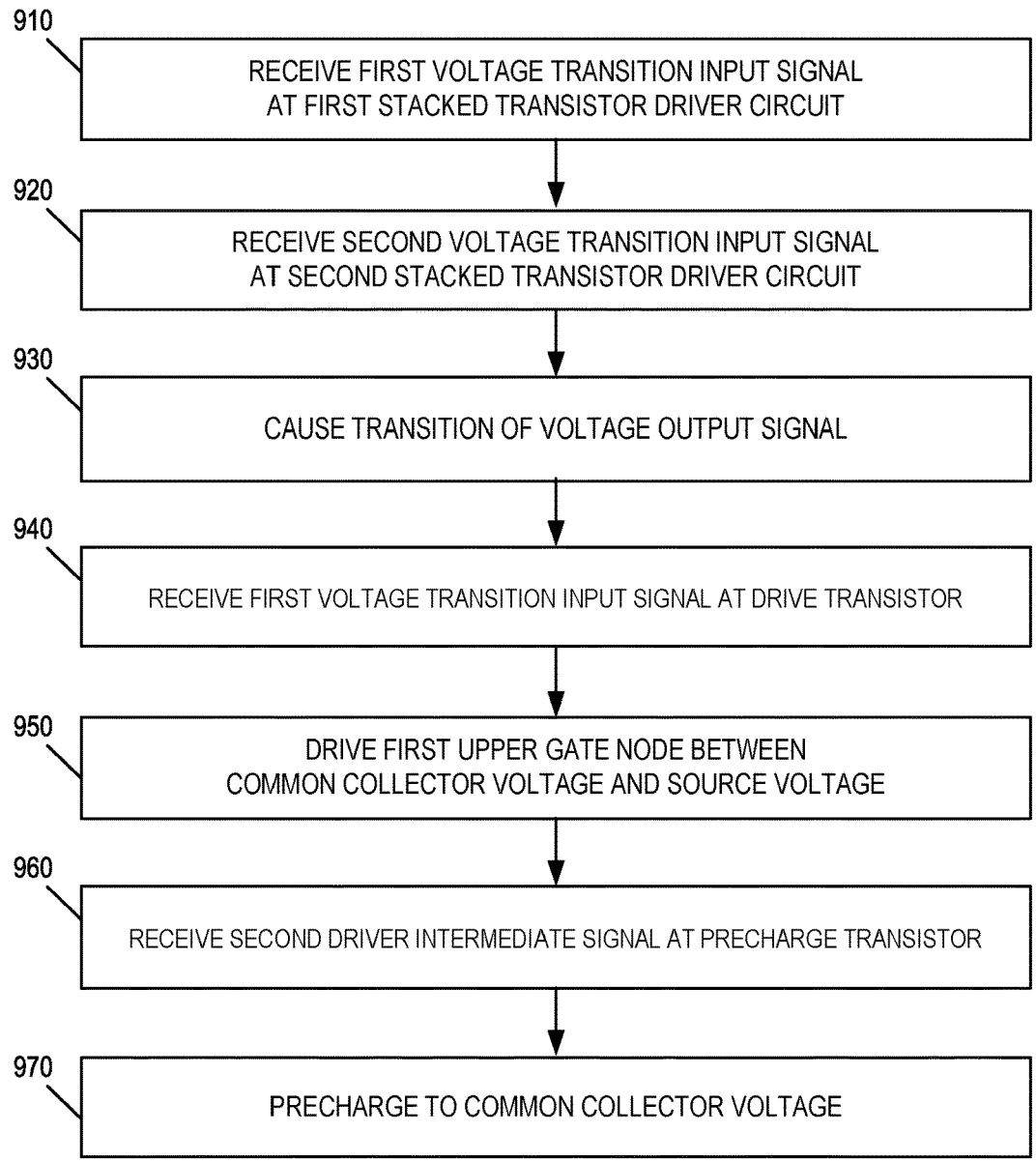
FIG. 9 is a flowchart illustrating a method, according to an embodiment.

FIG. 9 is a flowchart illustrating a method 900, according to an embodiment. Method 900 includes receiving 910 a first voltage transition input signal at a first driver gate node of a first stacked transistor driver circuit. The first stacked transistor driver circuit includes a first driver intermediate node coupled to a first lower gate node of a first stacked transistor voltage converter circuit. The first stacked transistor voltage converter circuit includes a first upper terminal, a first upper gate node, a first intermediate node, and the first lower gate node.

At 920, a second voltage transition input signal is received at a second driver gate node of a second stacked transistor driver circuit. The second voltage transition input signal includes a time-shifted version of the first voltage transition input signal. The second stacked transistor driver circuit includes a second driver intermediate node coupled to a second lower gate node of a second stacked transistor voltage converter circuit. The second stacked transistor voltage converter circuit includes a second upper terminal coupled to the first upper terminal, a second upper gate node, a second intermediate node coupled to the first intermediate node, and a second lower gate node.

Method 900 includes causing 930 a transition of a voltage output signal at the first upper terminal between a low voltage output and a high voltage output. The transition is responsive to the first voltage transition input signal and the second voltage transition input signal. In an example, the first stacked transistor voltage converter circuit is coupled to a common collector voltage, and the high voltage output is greater than the common collector voltage. The high voltage output may be substantially equal to twice the common collector voltage.

In an example, the voltage output signal includes a high to low transition. In this example, the first voltage transition input signal includes a first delayed version of the second voltage transition input signal, and the transition causes the voltage output signal to change from the high voltage output to the low voltage output. In another example, the voltage output signal includes a low to high transition. In this example, the second voltage transition input signal includes a second delayed version of the first voltage transition input signal, and the transition causes the voltage output signal to change from the low voltage output to the high voltage output.

Method 900 may further include receiving 940 the first voltage transition input signal at a drive transistor. The drive transistor may include a drive drain coupled to the common collector voltage, a drive gate coupled to the first voltage transition input signal, and a drive source coupled to the first upper gate node of the first stacked transistor voltage converter circuit. Method 900 may further include driving 950, responsive to receiving the first voltage transition input signal at the drive transistor. The first upper gate node may be coupled between the common collector voltage and a source voltage at the first intermediate node based on the first voltage transition input signal.

Method 900 may further include receiving 960 a second driver intermediate signal at a precharge transistor. The precharge transistor may include a precharge drain coupled to the common collector voltage, a precharge gate coupled to the second driver intermediate node, and a precharge source coupled to precharge the first driver intermediate node to the common collector voltage.

In an example, the time shift between the first voltage transition input signal and the second voltage transition input signal is selected to provide a first energy efficiency improvement. In another example, a size ratio between the first stacked transistor voltage converter circuit and the second stacked transistor voltage converter circuit is selected to provide a second energy efficiency improvement.

Figure 10:
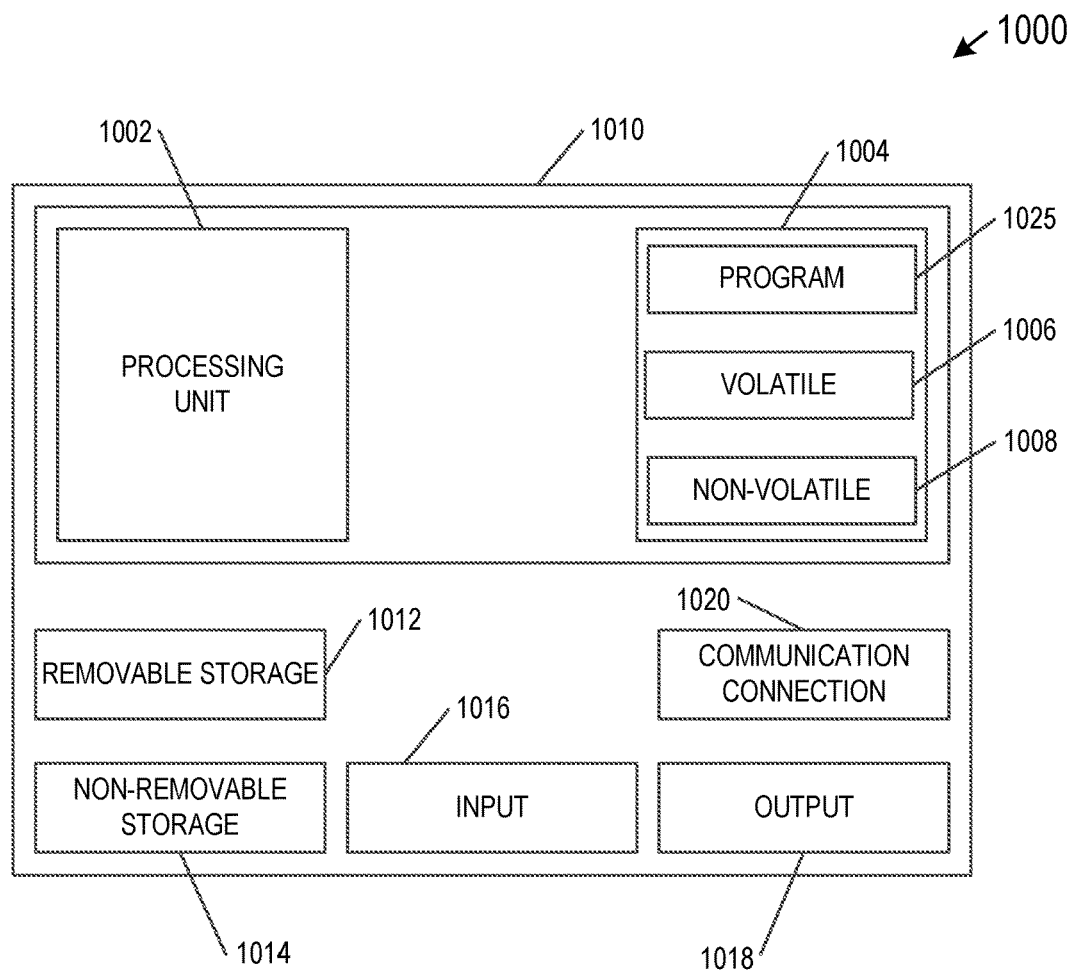
FIG. 10 is a block diagram of a computing device, according to an embodiment.

FIG. 10 is a block diagram of a computing device 1000, according to an embodiment. The performance of one or more components within computing device 1000 may be improved by including one or more of the circuits or circuitry methods described herein. Computing device 1000 may include a first stacked transistor voltage converter circuit, a first stacked transistor driver circuit coupled to the first stacked transistor voltage converter circuit, a second stacked transistor voltage converter circuit coupled to the first stacked transistor voltage converter circuit, and a second stacked transistor driver circuit coupled to the second stacked transistor voltage converter circuit.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 10 is an example of a client device that may invoke methods described herein over a network. In some embodiments, the computing device of FIG. 10 is an example of one or more of the personal computer, smartphone, tablet, or various servers.

One example computing device in the form of a computer 1010, may include a processing unit 1002, memory 1004, removable storage 1012, and non-removable storage 1014. Although the example computing device is illustrated and described as computer 1010, the computing device may be in different forms in different embodiments. For example, the computing device may instead be a smartphone, a tablet, or other computing device including the same or similar elements as illustrated and described with regard to FIG. 10. Further, although the various data storage elements are illustrated as part of the computer 1010, the storage may include cloud-based storage accessible via a network, such as the Internet.

Returning to the computer 1010, memory 1004 may include volatile memory 1006 and non-volatile memory 1008. Computer 1010 may include or have access to a computing environment that includes a variety of computer-readable media, such as volatile memory 1006 and non-volatile memory 1008, removable storage 1012 and non-removable storage 1014. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 1010 may include or have access to a computing environment that includes input 1016, output 1018, and a communication connection 1020. The input 1016 may include one or more of a touchscreen, touchpad, mouse, keyboard, camera, and other input devices. The input 1016 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 1020 to connect to one or more remote computers, such as database servers, web servers, and another computing device. An example remote computer may include a personal computer (PC), server, router, network PC, a peer device or other common network node, or the like. The communication connection 1020 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 1002 of the computer 1010. A hard drive (magnetic disk or solid state), CD-ROM, and RAM are some examples of articles including a non-transitory computer-readable medium. For example, various computer programs 1025 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is an apparatus comprising: a first stacked transistor voltage converter circuit; a first stacked transistor driver circuit coupled to the first stacked transistor voltage converter circuit, the first stacked transistor driver circuit to receive a first voltage transition input signal; a second stacked transistor voltage converter circuit coupled to the first stacked transistor voltage converter circuit; and a second stacked transistor driver circuit coupled to the second stacked transistor voltage converter circuit, the second stacked transistor driver circuit to receive a second voltage transition input signal; wherein the first stacked transistor voltage converter circuit and the second stacked transistor voltage converter circuit are configured to change a voltage output signal at a first upper drain node of the first stacked transistor voltage converter circuit from a first logical state to a second logical state responsive to the first voltage transition input signal and the second voltage transition input signal.

In Example 2, the subject matter of Example 1 includes, wherein: the first logical state includes a high voltage logical state; the second logical state includes a low voltage logical state; and the first voltage transition input signal includes a first delayed version of the second voltage transition input signal.

In Example 3, the subject matter of Example 2 includes, wherein: the first stacked transistor voltage converter circuit is coupled to a common collector voltage; and the high voltage logical state is greater than the common collector voltage.

In Example 4, the subject matter of Example 3 includes, wherein the high voltage logical state is substantially equal to twice the common collector voltage.

In Example 5, the subject matter of Examples 1-4 includes, wherein: the first logical state includes a low voltage logical state; the second logical state includes a high voltage logical state; and the second voltage transition input signal includes a second delayed version of the first voltage transition input signal.

In Example 6, the subject matter of Example 5 includes, wherein: the first stacked transistor voltage converter circuit is coupled to a common collector voltage; and the high voltage logical state is greater than the common collector voltage.

In Example 7, the subject matter of Example 6 includes, wherein the high voltage logical state is substantially equal to twice the common collector voltage.

In Example 8, the subject matter of Examples 1-7 includes, a drive transistor coupled to a first upper gate node of the first stacked transistor voltage converter circuit, the drive transistor to: receive the first voltage transition input signal; and drive the first upper gate node between a common collector voltage and a source voltage based on the first voltage transition input signal.

In Example 9, the subject matter of Example 8 includes, a precharge transistor coupled to the first stacked transistor voltage converter circuit and to the second stacked transistor voltage converter circuit, the precharge transistor to precharge a first driver intermediate node to the common collector voltage.

In Example 10, the subject matter of Examples 1-9 includes, wherein a time shift between the first voltage transition input signal and the second voltage transition input signal is selected to provide a first energy efficiency improvement.

In Example 11, the subject matter of Examples 1-10 includes, wherein a size ratio between the first stacked transistor voltage converter circuit and the second stacked transistor voltage converter circuit is selected to provide a second energy efficiency improvement.

Example 12 is a method comprising: receiving a first voltage transition input signal at a first driver gate node of a first stacked transistor driver circuit, the first stacked transistor driver circuit including a first driver intermediate node coupled to a first lower gate node of a first stacked transistor voltage converter circuit, the first stacked transistor voltage converter circuit including a first upper drain node, a first upper gate node, a first intermediate node, and the first lower gate node; receiving a second voltage transition input signal at a second driver gate node of a second stacked transistor driver circuit, the second voltage transition input signal including a time-shifted version of the first voltage transition input signal, the second stacked transistor driver circuit including a second driver intermediate node coupled to a second lower gate node of a second stacked transistor voltage converter circuit, the second stacked transistor voltage converter circuit including a second upper drain node coupled to the first upper drain node, a second upper gate node, a second intermediate node coupled to the first intermediate node, and a second lower gate node; and causing a transition of a voltage output signal at the first upper drain node between a low voltage logical state and a high voltage logical state responsive to the first voltage transition input signal and the second voltage transition input signal.

In Example 13, the subject matter of Example 12 includes, wherein: the first stacked transistor voltage converter circuit is coupled to a common collector voltage; and the high voltage logical state is greater than the common collector voltage.

In Example 14, the subject matter of Example 13 includes, wherein the high voltage logical state is substantially equal to twice the common collector voltage.

In Example 15, the subject matter of Examples 12-14 includes, wherein: the voltage output signal includes a high to low logical transition; the first voltage transition input signal includes a first delayed version of the second voltage transition input signal; and the transition of the voltage output signal is from the high voltage logical state to the low voltage logical state.

In Example 16, the subject matter of Examples 12-15 includes, wherein: the voltage output signal includes a low to high logical transition; the second voltage transition input signal includes a second delayed version of the first voltage transition input signal; and the transition of the voltage output signal is from the low voltage logical state to the high voltage logical state.

In Example 17, the subject matter of Examples 13-16 includes, receiving the first voltage transition input signal at a drive transistor, the drive transistor including: a drive drain coupled to the common collector voltage; a drive gate coupled to the first voltage transition input signal; a drive source coupled to the first upper gate node of the first stacked transistor voltage converter circuit; and driving, responsive to receiving the first voltage transition input signal at the drive transistor, the first upper gate node between the common collector voltage and a source voltage at the first intermediate node based on the first voltage transition input signal.

In Example 18, the subject matter of Example 17 includes, receiving a second driver intermediate signal at a precharge transistor, the precharge transistor including: a precharge drain coupled to the common collector voltage; a precharge gate coupled to the second driver intermediate node; and a precharge source coupled to precharge the first driver intermediate node to the common collector voltage.

In Example 19, the subject matter of Examples 12-18 includes, wherein a time shift between the first voltage transition input signal and the second voltage transition input signal is selected to provide a first energy efficiency improvement.

In Example 20, the subject matter of Examples 12-19 includes, wherein a size ratio between the first stacked transistor voltage converter circuit and the second stacked transistor voltage converter circuit is selected to provide a second energy efficiency improvement.

Example 21 is a non-transitory machine-readable storage medium, comprising instructions that, responsive to being executed with processing circuitry of a computer-controlled device, cause the processing circuitry to: receiving a first voltage transition input signal at a first driver gate node of a first stacked transistor driver circuit, the first stacked transistor driver circuit including a first driver intermediate node coupled to a first lower gate node of a first stacked transistor voltage converter circuit, the first stacked transistor voltage converter circuit including a first upper drain node, a first upper gate node, a first intermediate node, and the first lower gate node; receiving a second voltage transition input signal at a second driver gate node of a second stacked transistor driver circuit, the second voltage transition input signal including a time-shifted version of the first voltage transition input signal, the second stacked transistor driver circuit including a second driver intermediate node coupled to a second lower gate node of a second stacked transistor voltage converter circuit, the second stacked transistor voltage converter circuit including a second upper drain node coupled to the first upper drain node, a second upper gate node, a second intermediate node coupled to the first intermediate node, and a second lower gate node; and causing a transition of a voltage output signal at the first upper drain node between a low voltage logical state and a high voltage logical state responsive to the first voltage transition input signal and the second voltage transition input signal.

In Example 22, the subject matter of Example 21 includes, wherein: the first stacked transistor voltage converter circuit is coupled to a common collector voltage; and the high voltage logical state is greater than the common collector voltage.

In Example 23, the subject matter of Example 22 includes, wherein the high voltage logical state is substantially equal to twice the common collector voltage.

In Example 24, the subject matter of Examples 21-23 includes, wherein: the voltage output signal includes a high to low logical transition; the first voltage transition input signal includes a first delayed version of the second voltage transition input signal; and the transition of the voltage output signal is from the high voltage logical state to the low voltage logical state.

In Example 25, the subject matter of Examples 21-24 includes, wherein: the voltage output signal includes a low to high logical transition; the second voltage transition input signal includes a second delayed version of the first voltage transition input signal; and the transition of the voltage output signal is from the low voltage logical state to the high voltage logical state.

In Example 26, the subject matter of Examples 22-25 includes, the instructions further causing the processing circuitry to: receiving the first voltage transition input signal at a drive transistor, the drive transistor including: a drive drain coupled to the common collector voltage; a drive gate coupled to the first voltage transition input signal; a drive source coupled to the first upper gate node of the first stacked transistor voltage converter circuit; and driving, responsive to receiving the first voltage transition input signal at the drive transistor, the first upper gate node between the common collector voltage and a source voltage at the first intermediate node based on the first voltage transition input signal.

In Example 27, the subject matter of Example 26 includes, the instructions further causing the processing circuitry to receiving a second driver intermediate signal at a precharge transistor, the precharge transistor including: a precharge drain coupled to the common collector voltage; a precharge gate coupled to the second driver intermediate node; and a precharge source coupled to precharge the first driver intermediate node to the common collector voltage.

In Example 28, the subject matter of Examples 21-27 includes, wherein a time shift between the first voltage transition input signal and the second voltage transition input signal is selected to provide a first energy efficiency improvement.

In Example 29, the subject matter of Examples 21-28 includes, wherein a size ratio between the first stacked transistor voltage converter circuit and the second stacked transistor voltage converter circuit is selected to provide a second energy efficiency improvement.

Example 30 is an apparatus comprising: means for receiving a first voltage transition input signal at a first driver gate node of a first stacked transistor driver circuit, the first stacked transistor driver circuit including a first driver intermediate node coupled to a first lower gate node of a first stacked transistor voltage converter circuit, the first stacked transistor voltage converter circuit including a first upper drain node, a first upper gate node, a first intermediate node, and the first lower gate node; means for receiving a second voltage transition input signal at a second driver gate node of a second stacked transistor driver circuit, the second voltage transition input signal including a time-shifted version of the first voltage transition input signal, the second stacked transistor driver circuit including a second driver intermediate node coupled to a second lower gate node of a second stacked transistor voltage converter circuit, the second stacked transistor voltage converter circuit including a second upper drain node coupled to the first upper drain node, a second upper gate node, a second intermediate node coupled to the first intermediate node, and a second lower gate node; and means for causing a transition of a voltage output signal at the first upper drain node between a low voltage logical state and a high voltage logical state responsive to the first voltage transition input signal and the second voltage transition input signal.

In Example 31, the subject matter of Example 30 includes, wherein: the first stacked transistor voltage converter circuit is coupled to a common collector voltage; and the high voltage logical state is greater than the common collector voltage.

In Example 32, the subject matter of Example 31 includes, wherein the high voltage logical state is substantially equal to twice the common collector voltage.

In Example 33, the subject matter of Examples 30-32 includes, wherein: the voltage output signal includes a high to low logical transition; the first voltage transition input signal includes a first delayed version of the second voltage transition input signal; and the transition of the voltage output signal is from the high voltage logical state to the low voltage logical state.

In Example 34, the subject matter of Examples 30-33 includes, wherein: the voltage output signal includes a low to high logical transition; the second voltage transition input signal includes a second delayed version of the first voltage transition input signal; and the transition of the voltage output signal is from the low voltage logical state to the high voltage logical state.

In Example 35, the subject matter of Examples 31-34 includes, means for receiving the first voltage transition input signal at a drive transistor, the drive transistor including: a drive drain coupled to the common collector voltage; a drive gate coupled to the first voltage transition input signal; a drive source coupled to the first upper gate node of the first stacked transistor voltage converter circuit; and means for driving, responsive to receiving the first voltage transition input signal at the drive transistor, the first upper gate node between the common collector voltage and a source voltage at the first intermediate node based on the first voltage transition input signal.

In Example 36, the subject matter of Example 35 includes, means for receiving a second driver intermediate signal at a precharge transistor, the precharge transistor including: a precharge drain coupled to the common collector voltage; a precharge gate coupled to the second driver intermediate node; and a precharge source coupled to precharge the first driver intermediate node to the common collector voltage.

In Example 37, the subject matter of Examples 30-36 includes, wherein a time shift between the first voltage transition input signal and the second voltage transition input signal is selected to provide a first energy efficiency improvement.

In Example 38, the subject matter of Examples 30-37 includes, wherein a size ratio between the first stacked transistor voltage converter circuit and the second stacked transistor voltage converter circuit is selected to provide a second energy efficiency improvement.

Example 39 is an apparatus comprising: a first stacked transistor voltage converter circuit including a first upper drain node, a first upper gate node coupled to a common collector voltage, a first intermediate node, and a first lower gate node; a first stacked transistor driver circuit including a first driver intermediate node coupled to the first lower gate node and a first driver gate node coupled to a first voltage transition input signal; a second stacked transistor voltage converter circuit including a second upper drain node coupled to the first upper drain node, a second upper gate node, a second intermediate node coupled to the first intermediate node, and a second lower gate node; and a second stacked transistor driver circuit including a second driver intermediate node coupled to the second lower gate node and a second driver gate node coupled to a second voltage transition input signal, the second voltage transition input signal including a time-shifted version of the first voltage transition input signal; wherein the first stacked transistor voltage converter circuit and the second stacked transistor voltage converter circuit are configured to change a voltage output signal at a first upper drain node of the first stacked transistor voltage converter circuit from a first logical state to a second logical state responsive to the first voltage transition input signal and the second voltage transition input signal.

In Example 40, the subject matter of Example 39 includes, wherein: the first logical state includes a high voltage logical state; the second logical state includes a low voltage logical state; and the first voltage transition input signal includes a first delayed version of the second voltage transition input signal.

In Example 41, the subject matter of Example 40 includes, wherein: the first stacked transistor voltage converter circuit is coupled to a common collector voltage; and the high voltage logical state is greater than the common collector voltage.

In Example 42, the subject matter of Example 41 includes, wherein the high voltage logical state is substantially equal to twice the common collector voltage.

In Example 43, the subject matter of Examples 39-42 includes, wherein: the first logical state includes a low voltage logical state; the second logical state includes a high voltage logical state; and the second voltage transition input signal includes a second delayed version of the first voltage transition input signal.

In Example 44, the subject matter of Example 43 includes, wherein: the first stacked transistor voltage converter circuit is coupled to a common collector voltage; and the high voltage logical state is greater than the common collector voltage.

In Example 45, the subject matter of Example 44 includes, wherein the high voltage logical state is substantially equal to twice the common collector voltage.

In Example 46, the subject matter of Examples 39-45 includes, a drive transistor, the drive transistor including: a drive drain coupled to the common collector voltage; a drive gate coupled to the first voltage transition input signal; and a drive source coupled to the first upper gate node of the first stacked transistor voltage converter circuit; wherein the drive transistor drives the first upper gate node between the common collector voltage and a source voltage at the first intermediate node based on the first voltage transition input signal.

In Example 47, the subject matter of Example 46 includes, a precharge transistor, the precharge transistor including: a precharge drain coupled to the common collector voltage; a precharge gate coupled to the second driver intermediate node; and a precharge source coupled to precharge the first driver intermediate node to the common collector voltage.

In Example 48, the subject matter of Examples 39-47 includes, wherein a time shift between the first voltage transition input signal and the second voltage transition input signal is selected to provide a first energy efficiency improvement.

In Example 49, the subject matter of Examples 39-48 includes, wherein a size ratio between the first stacked transistor voltage converter circuit and the second stacked transistor voltage converter circuit is selected to provide a second energy efficiency improvement.

Example 50 is an apparatus comprising: a first stacked transistor voltage converter circuit including a first upper terminal coupled to a voltage output node, a first upper gate node coupled to a common collector voltage, a first intermediate node, and a first lower gate node; a first stacked transistor driver circuit including a first driver intermediate node coupled to the first lower gate node and a first driver gate node coupled to a first voltage transition input signal; and a second stacked transistor voltage converter circuit including a second upper terminal coupled to the voltage output node, a second upper gate node, a second intermediate node coupled to the first intermediate node, and a second lower gate node.

In Example 51, the subject matter of Example 50 includes, a second stacked transistor driver circuit including a second driver intermediate node coupled to the second lower gate node and a second driver gate node coupled to a second voltage transition input signal, the second voltage transition input signal including a time-shifted version of the first voltage transition input signal.

In Example 52, the subject matter of Example 51 includes, wherein: the first stacked transistor voltage converter circuit further includes a first pair of n-channel transistors; the first stacked transistor driver circuit further includes a first p-channel driver transistor and a first n-channel driver transistor; the second stacked transistor voltage converter circuit further includes a second pair of n-channel transistors; and the second stacked transistor driver circuit further includes a second p-channel driver transistor and a second n-channel driver transistor.

In Example 53, the subject matter of Example 52 includes, wherein: the first pair of n-channel transistors include larger conducting channels than the first p-channel driver transistor and the first n-channel driver transistor; and the second pair of n-channel transistors include larger conducting channels than the second p-channel driver transistor and the second n-channel driver transistor.

In Example 54, the subject matter of Examples 51-53 includes, wherein the first upper gate node is coupled to a common collector voltage.

In Example 55, the subject matter of Examples 51-54 includes, a drive transistor, the drive transistor including: a drive input terminal coupled to the common collector voltage; a drive gate terminal coupled to the first voltage transition input signal; and a drive output terminal coupled to the first upper gate node of the first stacked transistor voltage converter circuit.

In Example 56, the subject matter of Example 55 includes, wherein the drive transistor further includes a third p-channel driver transistor.

In Example 57, the subject matter of Examples 55-56 includes, a precharge transistor, the precharge transistor including: a precharge input terminal coupled to the common collector voltage; a precharge gate coupled to the second driver intermediate node; and a precharge output terminal coupled to precharge the first driver intermediate node to the common collector voltage.

In Example 58, the subject matter of Example 57 includes, wherein the precharge transistor further includes a p-channel precharge transistor.

In Example 59, the subject matter of Examples 51-58 includes, wherein a time shift between the first voltage transition input signal and the second voltage transition input signal is selected to provide a first energy efficiency improvement.

In Example 60, the subject matter of Examples 51-59 includes, wherein a size ratio between the first stacked transistor voltage converter circuit and the second stacked transistor voltage converter circuit is selected to provide a second energy efficiency improvement.

Example 61 is at least one machine-readable medium including instructions that, when executed by processing circuitry, cause the processing circuitry to perform operations to implement of any of Examples 1-60.

Example 62 is an apparatus comprising means to implement of any of Examples 1-60.

Example 63 is a system to implement of any of Examples 1-60.

Example 64 is a method to implement of any of Examples 1-60.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:
1. An apparatus comprising:
   a first stacked transistor voltage converter circuit;
   a first stacked transistor driver circuit coupled to the first stacked transistor voltage converter circuit, the first stacked transistor driver circuit to receive a first voltage transition input signal;
   a second stacked transistor voltage converter circuit coupled to the first stacked transistor voltage converter circuit; and a second stacked transistor driver circuit coupled to the second stacked transistor voltage converter circuit, the second stacked transistor driver circuit to receive a second voltage transition input signal;

wherein the first stacked transistor voltage converter circuit and the second stacked transistor voltage converter circuit are configured to change a voltage output signal at a first upper drain node of the first stacked transistor voltage converter circuit from a first logical state to a second logical state responsive to the first voltage transition input signal and the second voltage transition input signal.

2. The apparatus of claim 1, wherein:
the first logical state includes a low voltage logical state;
the second logical state includes a high voltage logical state; and
the second voltage transition input signal includes a second delayed version of the first voltage transition input signal.

3. The apparatus of claim 2, wherein:
the first stacked transistor voltage converter circuit is coupled to a common collector voltage; and
the high voltage logical state is greater than the common collector voltage.

4. The apparatus of claim 1, further including a drive transistor coupled to a first upper gate node of the first stacked transistor voltage converter circuit, the drive transistor to:
receive the first voltage transition input signal; and
drive the first upper gate node between a common collector voltage and a source voltage based on the first voltage transition input signal.

5. The apparatus of claim 4, further including a precharge transistor coupled to the first stacked transistor voltage converter circuit and to the second stacked transistor voltage converter circuit, the precharge transistor to precharge a first driver intermediate node to the common collector voltage.

6. The apparatus of claim 1, wherein a time shift between the first voltage transition input signal and the second voltage transition input signal is selected to provide a first energy efficiency improvement.

7. The apparatus of claim 1, wherein a size ratio between the first stacked transistor voltage converter circuit and the second stacked transistor voltage converter circuit is selected to provide a second energy efficiency improvement.

8. A method comprising:
receiving a first voltage transition input signal at a first driver gate node of a first stacked transistor driver circuit, the first stacked transistor driver circuit including a first driver intermediate node coupled to a first lower gate node of a first stacked transistor voltage converter circuit, the first stacked transistor voltage converter circuit including a first upper drain node, a first upper gate node, a first intermediate node, and the first lower gate node;
receiving a second voltage transition input signal at a second driver gate node of a second stacked transistor driver circuit, the second voltage transition input signal including a time-shifted version of the first voltage transition input signal, the second stacked transistor driver circuit including a second driver intermediate node coupled to a second lower gate node of a second stacked transistor voltage converter circuit, the second stacked transistor voltage converter circuit including a second upper drain node coupled to the first upper drain node, a second upper gate node, a second intermediate node coupled to the first intermediate node, and a second lower gate node; and causing a transition of a voltage output signal at the first upper drain node between a low voltage logical state and a high voltage logical state responsive to the first voltage transition input signal and the second voltage transition input signal.

9. The method of claim 8, wherein:
the first stacked transistor voltage converter circuit is coupled to a common collector voltage; and
the high voltage logical state is greater than the common collector voltage.

10. The method of claim 9, wherein the high voltage logical state is substantially equal to twice the common collector voltage.

11. The method of claim 9, further including:
receiving the first voltage transition input signal at a drive transistor, the drive transistor including:
a drive drain coupled to the common collector voltage;
a drive gate coupled to the first voltage transition input signal;
a drive source coupled to the first upper gate node of the first stacked transistor voltage converter circuit; and
driving, responsive to receiving the first voltage transition input signal at the drive transistor, the first upper gate node between the common collector voltage and a source voltage at the first intermediate node based on the first voltage transition input signal.

12. The method of claim 11, further including receiving a second driver intermediate signal at a precharge transistor, the precharge transistor including:
a precharge drain coupled to the common collector voltage;
a precharge gate coupled to the second driver intermediate node; and
a precharge source coupled to precharge the first driver intermediate node to the common collector voltage.

13. The method of claim 8, wherein:
the voltage output signal includes a high to low logical transition;
the first voltage transition input signal includes a first delayed version of the second voltage transition input signal; and
the transition of the voltage output signal is from the high voltage logical state to the low voltage logical state.

14. The method of claim 8, wherein:
the voltage output signal includes a low to high logical transition;
the second voltage transition input signal includes a second delayed version of the first voltage transition input signal; and
the transition of the voltage output signal is from the low voltage logical state to the high voltage logical state.

15. An apparatus comprising:
a first stacked transistor voltage converter circuit including a first upper terminal coupled to a voltage output node, a first upper gate node coupled to a common collector voltage, a first intermediate node, and a first lower gate node;
a first stacked transistor driver circuit including a first driver intermediate node coupled to the first lower gate node and a first driver gate node coupled to a first voltage transition input signal; and
a second stacked transistor voltage converter circuit including a second upper terminal coupled to the voltage output node, a second upper gate node, a second intermediate node coupled to the first intermediate node, and a second lower gate node.

16. The apparatus of claim 15, further including a second stacked transistor driver circuit including a second driver intermediate node coupled to the second lower gate node and a second driver gate node coupled to a second voltage transition input signal, the second voltage transition input signal including a time-shifted version of the first voltage transition input signal.

17. The apparatus of claim 16, wherein:
the first stacked transistor voltage converter circuit further includes a first pair of n-channel transistors;
the first stacked transistor driver circuit further includes a first p-channel driver transistor and a first n-channel driver transistor;
the second stacked transistor voltage converter circuit further includes a second pair of n-channel transistors; and
the second stacked transistor driver circuit further includes a second p-channel driver transistor and a second n-channel driver transistor.

18. The apparatus of claim 17, wherein:
the first pair of n-channel transistors include larger conducting channels than the first p-channel driver transistor and the first n-channel driver transistor; and
the second pair of n-channel transistors include larger conducting channels than the second p-channel driver transistor and the second n-channel driver transistor.

19. The apparatus of claim 16, further including a drive transistor, the drive transistor including:
a drive input terminal coupled to the common collector voltage;
a drive gate terminal coupled to the first voltage transition input signal; and
a drive output terminal coupled to the first upper gate node of the first stacked transistor voltage converter circuit.

20. The apparatus of claim 19, further including a precharge transistor, the precharge transistor including:
a precharge input terminal coupled to the common collector voltage;
a precharge gate coupled to the second driver intermediate node; and
a precharge output terminal coupled to precharge the first driver intermediate node to the common collector voltage.

* * * * *